(12) United States Patent
Hirosaki et al.

(10) Patent No.: US 10,479,935 B2
(45) Date of Patent: Nov. 19, 2019

(54) FLUORESCENT MATERIAL, METHOD OF PRODUCING THE SAME, AND LIGHT EMITTING DEVICE USING THE SAME

(71) Applicants: NATIONAL INSTITUTE FOR MATERIALS SCIENCE, Tsukuba-shi, Ibaraki (JP); NICHIA CORPORATION, Anan-shi, Tokushima (JP)

(72) Inventors: Naoto Hirosaki, Tsukuba (JP); Takayuki Shinohara, Anan (JP); Shoji Hosokawa, Tokushima (JP)

(73) Assignees: NATIONAL INSTITUTE FOR MATERIALS SCIENCE, Tsukuba-shi (JP); NICHIA CORPORATION, Anan-shi (JP)

( * ) Notice: Subject to any disclaimer, the term of this patent is extended or adjusted under 35 U.S.C. 154(b) by 143 days.

(21) Appl. No.: 15/843,727

(22) Filed: Dec. 15, 2017

(65) Prior Publication Data

US 2018/0171223 A1 Jun. 21, 2018

(30) Foreign Application Priority Data

Dec. 15, 2016 (JP) .................................. 2016-243653

(51) Int. Cl.
| | | |
|---|---|---|
| *H01L 33/00* | (2010.01) | |
| *C09K 11/77* | (2006.01) | |
| *C01F 17/00* | (2006.01) | |
| *C01B 21/082* | (2006.01) | |
| *H01L 33/50* | (2010.01) | |

(52) U.S. Cl.
CPC ...... *C09K 11/7734* (2013.01); *C01B 21/0826* (2013.01); *C01F 17/0012* (2013.01); *C01P 2002/72* (2013.01); *C01P 2002/84* (2013.01); *H01L 33/502* (2013.01)

(58) Field of Classification Search
CPC ............. C09K 11/7734; C01F 17/0012; H01L 33/502; H01L 31/02322; H01L 2251/5376
USPC .......................................................... 257/98
See application file for complete search history.

(56) References Cited

FOREIGN PATENT DOCUMENTS

| | | | |
|---|---|---|---|
| JP | 2002-363554 | A | 12/2002 |
| JP | 2005-255895 | A | 9/2005 |
| WO | 2007-066732 | A1 | 6/2007 |
| WO | 2017-170453 | A1 | 10/2017 |

OTHER PUBLICATIONS

Kechele et al., (Sr1-xCax)(11+16y-25z)/2(Si1-yAly)16(N1-z0z)25 (x=0.24, y=0.18, z=0.19)—A Novel Sialon with a Highly Condensed Silicate Framework European Journal of Inorganic Chemistry, vol. 2009, Issue 22, Aug. 2009, pp. 3326-3332.

*Primary Examiner* — Elias Ullah
(74) *Attorney, Agent, or Firm* — Hunton Andrews Kurth LLP

(57) ABSTRACT

Provided are a fluorescent material having a high light emission intensity, a method for producing the same, and a light emitting device using the same. The present fluorescent material includes a composition represented by formula (I): $Si_uEu_vAl_wO_xN_y$, wherein when the sum of a parameter u and a parameter w is taken as 13, parameters u, v, w, x, and y in the formula (I) satisfy the following formulae (1) to (5).

| | |
|---|---|
| $2.77 \leq u \leq 2.88$ | (1) |
| $0.04 \leq v \leq 0.08$ | (2) |
| $10.12 \leq w \leq 10.23$ | (3) |
| $0.42 \leq x \leq 0.95$ | (4) |
| $12.89 \leq y \leq 13.65$ | (5) |

8 Claims, 8 Drawing Sheets

FLUORESCENT MATERIAL, METHOD OF PRODUCING THE SAME, AND LIGHT EMITTING DEVICE USING THE SAME

CROSS-REFERENCE TO RELATED PATENT APPLICATION

The present application claims priority under 35 U. S. C. § 119 to Japanese Patent Application No. 2016-243653, filed Dec. 15, 2016, the disclosure of which is hereby incorporated by reference in its entirety.

BACKGROUND

Technical Field

The present disclosure relates to a fluorescent material, a method for producing the same, and a light emitting device using the same.

Description of Related Art

Fluorescent materials are used for light emitting devices that emit light, such as a white color, a bulb color, and an orange color, through a combination with a light emitting diode (LED). These light emitting devices are used in various fields including general lighting, in-vehicle lighting, light sources of display devices, such as a display and a radar, and backlight light sources that are also applicable for liquid crystal display devices.

Various fluorescent materials which are excited by, for example, a blue light emitted from a light emitting element, thereby emitting a luminescent color, such as a yellow color, an orange color, a green color, and a blue color, are developed. As such a fluorescent material, for example, in Japanese Unexamined Patent Publication No. 2005-255895 discloses a β-sialon fluorescent material activated with $Eu^{2+}$ and in International Unexamined Patent Publication No. WO2007/066732 discloses a fluorescent material composed of, as a host crystal, AlN and activated with $Eu^{2+}$.

SUMMARY

In response to a requirement for high output of a light emitting device, a fluorescent material having a higher light emission intensity than conventional fluorescent materials is demanded.

Then, an object of the present disclosure is to provide a fluorescent material having a high light emission intensity, a method for producing the same, and a light emitting device using the same.

The means for achieving the aforementioned object are described below, and the present disclosure includes the following embodiments.

According to a first embodiment of the present disclosure, the fluorescent material includes a composition represented by formula (I): $Si_uEu_vAl_wO_xN_y$, wherein when the sum of a parameter u and a parameter w is taken as 13, parameters u, v, w, x, and y in the formula (I) each are values satisfying the ranges represented by the following formulae (1) to (5).

$$2.77 \leq u \leq 2.88 \tag{1}$$

$$0.04 \leq v \leq 0.08 \tag{2}$$

$$10.12 \leq w \leq 10.23 \tag{3}$$

$$0.42 \leq x \leq 0.95 \tag{4}$$

$$12.89 \leq y \leq 13.65 \tag{5}$$

According to a second embodiment of the present disclosure, the method of producing a fluorescent material includes subjecting a raw material mixture including $EuF_3$ to a heat treatment to obtain a fluorescent material including a composition represented by formula (I): $Si_uEu_vAl_wO_xN_y$, wherein when the sum of a parameter u and a parameter w is taken as 13, parameters u, v, w, x, and y in the formula (I) each are values satisfying the ranges represented by the following formulae (1) to (5).

$$2.77 \leq u \leq 2.88 \tag{1}$$

$$0.04 \leq v \leq 0.08 \tag{2}$$

$$10.12 \leq w \leq 10.23 \tag{3}$$

$$0.42 \leq x \leq 0.95 \tag{4}$$

$$12.89 \leq y \leq 13.65 \tag{5}$$

According to a third embodiment of the present disclosure, the light emitting device includes the aforementioned fluorescent material and an excitation light source.

According to embodiments of the present disclosure, it is possible to provide a fluorescent material having a high light emission intensity, a method of producing the same, and a light emitting device using the same.

DETAILED DESCRIPTION

Figure 1:
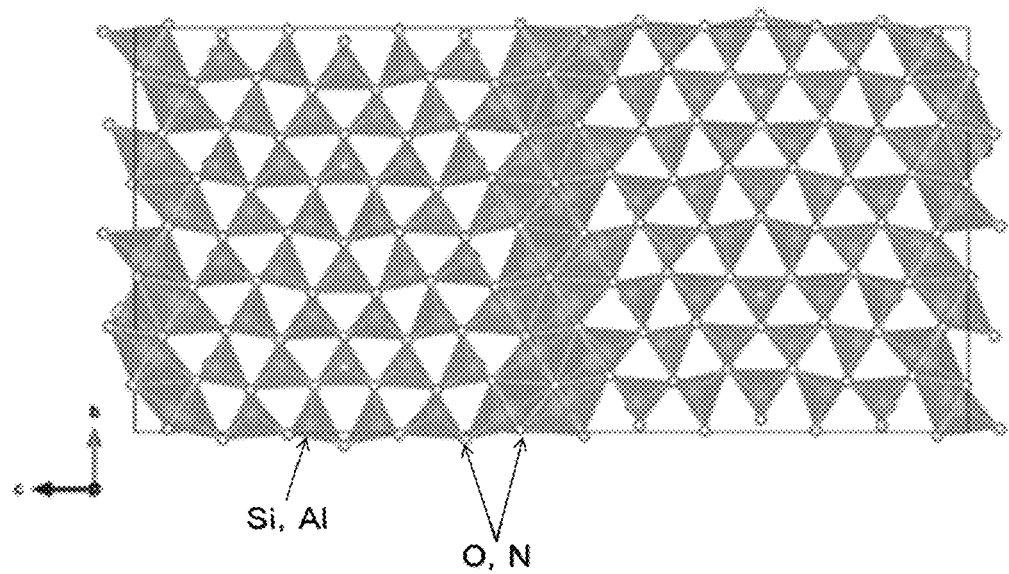
FIG. 1 is a schematic view showing a crystal structure of an inorganic compound represented by $Si_{2.24}Al_{10.76}O_{0.76}N_{13.24}$.

Embodiments of a fluorescent material, a method for producing the same, and a light emitting device using the same according to the present disclosure are hereunder described. However, the embodiments shown below are concerned with exemplifications for practicing the technical concept of the present invention, and it should be construed that the present invention is by no means limited to the following. The relationship between the color name and the chromaticity coordinate, the relationship between the wavelength range of light and the color name of monochromic light, and the like are in accordance with JIS Z8110.

First Embodiment

In the first embodiment, the fluorescent material is described. The fluorescent material of the present embodiment (hereinafter also referred to as "present fluorescent material") includes a composition represented by formula (I): $Si_uEu_vAl_wO_xN_y$, and when the sum of a parameter u and a parameter w is taken as 13, parameters u, v, w, x, and y in the formula (I) each are values satisfying the ranges represented by the following formulae (1) to (5).

$$2.77 \leq u \leq 2.88 \quad (1)$$

$$0.04 \leq v \leq 0.08 \quad (2)$$

$$10.12 \leq w \leq 10.23 \quad (3)$$

$$0.42 \leq x \leq 0.95 \quad (4)$$

$$12.89 \leq y \leq 13.65 \quad (5)$$

The present fluorescent material is preferably a material having, as a host crystal, a crystal structure identical with a crystal structure of an inorganic compound represented by $Si_{2.24}Al_{10.76}O_{0.76}N_{13.24}$, and an element serving as an activator is solid-solved in this crystal structure.

FIG. 1 is a schematic view showing a crystal structure of an inorganic compound represented by $Si_{2.24}Al_{10.76}O_{0.76}N_{13.24}$. As shown in FIG. 1, the crystal structure of the inorganic compound represented by $Si_{2.24}Al_{10.76}O_{0.76}N_{13.24}$ is a structure having a skeleton formed by linking tetrahedrons constituted of Si or Al and O or N.

The present fluorescent material has the composition represented by formula (I): $Si_uEu_vAl_wO_xN_y$, and in the formula (I), Eu is an activating element and acts as a light emitting center. In the crystal structure of the inorganic compound represented by $Si_{2.24}Al_{10.76}O_{0.76}N_{13.24}$, it may be considered that a part of the tetrahedron constituted of Si or Al and O or N comes out, and the activating element is arranged in a place where the tetrahedron has come out, whereby the activating element is introduced into the crystal.

Whether or not the present fluorescent material has, as a host crystal, a crystal structure identical with the crystal structure of the inorganic compound represented by $Si_{2.24}Al_{10.76}O_{0.76}N_{13.24}$ can be identified by means of powder X-ray diffractometry.

In the present specification, in the case where the fluorescent material not only has the target composition but also has, as the host crystal, a crystal structure essentially identical with the crystal structure of the inorganic compound represented by $Si_{2.24}Al_{10.76}O_{0.76}N_{13.24}$, there may be a case where the subject fluorescent material is expressed to be composed of the target crystal phase. In the case where the fluorescent material is a particle and an agglomerate of particles, there may be a case where the subject fluorescent material is expressed to be composed of the target crystal phase. Specifically, an X-ray diffraction simulation pattern obtained by the powder X-ray diffractometry using CuKα rays as calculated from the crystal structure of the inorganic compound represented by $Si_{2.24}Al_{10.76}O_{0.76}N_{13.24}$ is compared with the X-ray diffraction pattern of the fluorescent material. In the case where a Bragg angle (2θ) in a position of a main peak of the X-ray diffraction pattern as calculated from the crystal structure of the inorganic compound represented by $Si_{2.24}Al_{10.76}O_{0.76}N_{13.24}$ is analogous to a Bragg angle (2θ) in a position of a main peak in the X-ray diffraction pattern of the fluorescent material, it can be judged that the fluorescent material is composed of the target crystal phase. It is preferred that the intensity of the main peak in the X-ray diffraction pattern of the fluorescent material is analogous to the intensity of the main peak in the X-ray diffraction simulation pattern as calculated from the crystal structure of the inorganic compound represented by $Si_{2.24}Al_{10.76}O_{0.76}N_{13.24}$.

Figure 2:
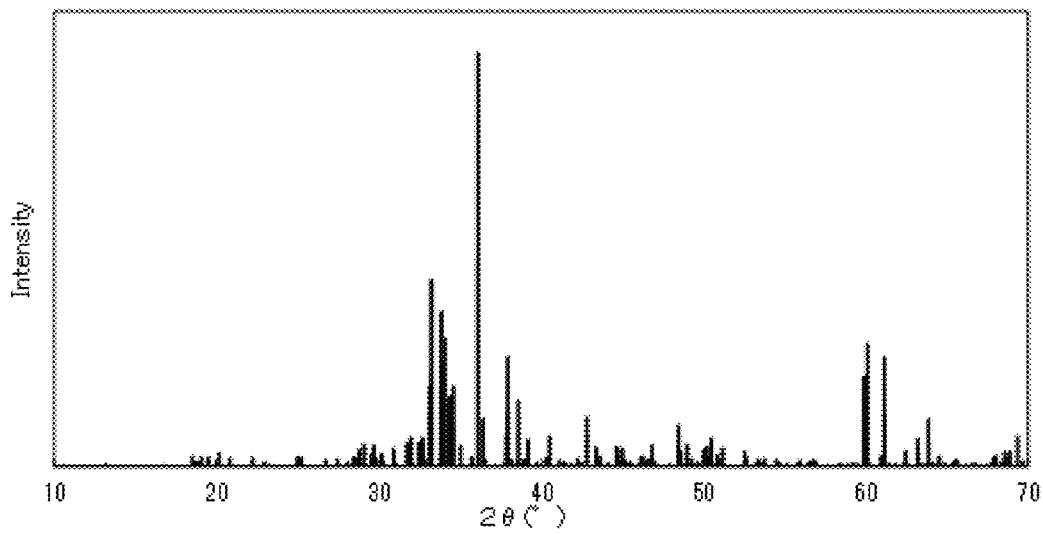
FIG. 2 is an X-ray diffraction simulation pattern using CuKα rays as calculated from a crystal structure of an inorganic compound represented by $Si_{2.24}Al_{10.76}O_{0.76}N_{13.24}$.

FIG. 2 is a graph showing an X-ray diffraction simulation pattern obtained by the powder X-ray diffractometry using CuKα rays as calculated from a crystal structure of the inorganic compound represented by $Si_{2.24}Al_{10.76}O_{0.76}N_{13.24}$.

For example, as for the X-ray diffraction pattern of the fluorescent material obtained by the powder X-ray diffractometry using CuKα rays, in the case where each peak existents at the Bragg angle (2θ) in the same position as a main peak in the X-ray diffraction simulation pattern of the crystal phase of the inorganic compound represented by $Si_{2.24}Al_{10.76}O_{0.76}N_{13.24}$ as shown in FIG. 2, it can be easily judged that the subject fluorescent material has, as the host crystal, a crystal structure identical with the crystal structure (crystal phase) of the inorganic compound represented by $Si_{2.24}Al_{10.76}O_{0.76}N_{13.24}$ and is composed of the target crystal phase.

The crystal structure of the inorganic compound represented by $Si_{2.24}Al_{10.76}O_{0.76}N_{13.24}$ belongs to an orthorhombic crystal system and belongs to the Cmcm space group (space group number 63 of International Tables for Crystallography), in which the lattice constants a, b, and c, each showing a length of an axis of the unit lattice obtained by means of crystal structure analysis, are values satisfying the following formulae (i) to (iii) respectively, and α, β, and γ, each showing an angle between the axes of the unit lattice, are 90°, respectively.

$$a = 0.30749 \pm 0.020 \text{ nm} \quad (i)$$

$$b = 1.87065 \pm 0.020 \text{ nm} \quad (ii)$$

$$c = 3.85432 \pm 0.020 \text{ nm} \quad (iii)$$

Data of the crystal structure of the inorganic compound represented by $Si_{2.24}Al_{10.76}O_{0.76}N_{13.24}$ are shown in Table 1. Table 1 shows the results obtained by measuring inorganic compounds synthesized by the present inventors by using a single crystal X-ray diffractometer (SMART APEXII Ultra, manufactured by Bruker AXS K.K.) and performing crystal structure analysis.

In the inorganic compound represented by $Si_{2.24}Al_{10.76}O_{0.76}N_{13.24}$, the respective atoms occupy positions of the atomic coordinates shown in Table 1. The atomic coordinates show the positions of the respective atoms in the unit lattice in terms of values of from 0 to 1 while defining the unit lattice as a unit. Based on the analysis results, in the crystal structure of the inorganic compound represented by $Si_{2.24}Al_{10.76}O_{0.76}N_{13.24}$, the respective atoms of Si, Al, O, and N exist, and Si and Al exist in sites of 18 kinds (Si,Al(1) to Si,Al(14B)), as shown in Table 1. In addition, there were obtained the analysis results in which O and N exist in sites of 15 kinds (O,N(1) to O,N(15)). In Table 1, the formula weight (Z) shows the number of chemical formulae included in the unit lattice. As shown in Table 1, in the inorganic compound represented by $Si_{2.24}Al_{10.76}O_{0.76}N_{13.24}$, the formula weight (Z) is 8, and eight molecules represented by $Si_{2.24}Al_{10.76}O_{0.76}N_{13.24}$ exist in the unit lattice represented by the lattice constants a, b, and c.

TABLE 1

| Crystal composition | $Si_{2.24}Al_{10.76}O_{0.76}N_{13.24}$ |
|---|---|
| Formula weight (Z) | 8 |
| Crystal system | Orthorhombic crystal system |
| Space group | Cmcm |
| Space group number | 63 |

| Lattice constant | | |
|---|---|---|
| a | 0.30749 | nm |
| b | 1.87065 | nm |
| c | 3.85432 | nm |
| α | 90 | degree |
| β | 90 | degree |
| γ | 90 | degree |

| Atomic coordinates | | | | |
|---|---|---|---|---|
| Atom | x | y | z | Site occupancy |
| Si,Al(1) | 0.0000 | 0.3351 | 0.2500 | 1.0 |
| Si,Al(2) | 0.0000 | 0.0901 | 0.2500 | 1.0 |
| Si,Al(3) | 0.0000 | 0.2777 | 0.6320 | 1.0 |
| Si,Al(4) | 0.0000 | 0.1004 | 0.1699 | 1.0 |
| Si,Al(5) | 0.0000 | 0.7112 | 0.2114 | 1.0 |
| Si,Al(6) | 0.0000 | 0.5728 | 0.1014 | 1.0 |
| Si,Al(7) | 0.0000 | 0.3334 | 0.1742 | 1.0 |
| Si,Al(8) | 0.0000 | 0.0466 | 0.6382 | 1.0 |
| Si,Al(9) | 0.0000 | 0.3423 | 0.0947 | 1.0 |
| Si,Al(10) | 0.0000 | 0.4812 | 0.2079 | 1.0 |
| Si,Al(11A) | 0.0000 | 0.1934 | 0.0661 | 0.7500 |
| Si,Al(11B) | 0.0000 | 0.1760 | 0.0502 | 0.2500 |
| Si,Al(12A) | 0.0000 | 0.2054 | 0.5143 | 0.4300 |
| Si,Al(12B) | 0.0000 | 0.1839 | 0.5294 | 0.5700 |
| Si,Al(13A) | 0.0000 | 0.5855 | 0.0236 | 0.5700 |
| Si,Al(13B) | 0.0000 | 0.5649 | 0.0082 | 0.4300 |
| Si,Al(14A) | 0.0000 | 0.0348 | 0.5601 | 0.6700 |
| Si,Al(14B) | 0.0000 | 0.0540 | 0.5464 | 0.3300 |
| O,N(1) | 0.0000 | 0.4913 | 0.0384 | 1.0 |
| O,N(2) | 0.0000 | 0.3854 | 0.2140 | 1.0 |
| O,N(3) | 0.0000 | 0.5323 | 0.2500 | 1.0 |
| O,N(4) | 0.0000 | 0.1275 | 0.5726 | 1.0 |
| O,N(5) | 0.0000 | 0.7620 | 0.2500 | 1.0 |
| O,N(6) | 0.0000 | 0.2615 | 0.0315 | 1.0 |
| O,N(7) | 0.0000 | 0.1545 | 0.2112 | 1.0 |
| O,N(8) | 0.0000 | 0.1155 | 0.0036 | 1.0 |
| O,N(9) | 0.0000 | 0.2287 | 0.6733 | 1.0 |
| O,N(10) | 0.0000 | 0.6398 | 0.0682 | 1.0 |
| O,N(11) | 0.0000 | 0.3967 | 0.1377 | 1.0 |
| O,N(12) | 0.0000 | 0.0175 | 0.1043 | 1.0 |
| O,N(13) | 0.0000 | 0.2490 | 0.1087 | 1.0 |
| O,N(14) | 0.0000 | 0.0051 | 0.1835 | 1.0 |
| O,N(15) | 0.0000 | 0.6248 | 0.1455 | 1.0 |

In the present fluorescent material having the composition represented by the formula (I): $Si_uEu_vAl_wO_xN_y$, a part or the whole of Si may be substituted with at least one element selected from the group consisting of Ge, Sn, Ti, Zr, and Hf, and furthermore, a part of Si may be substituted with at least one element selected from the group consisting of Al, B, Ga, In, Sc, Y, and La. In addition, in the present fluorescent material represented by the formula (I), a part or the whole of Al may be substituted with at least one element selected from the group consisting of B, Ga, In, Sc, Y, and La, and furthermore, a part of Al may be substituted with at least one element selected from the group consisting of Ge, Sn, Ti, Zr, and Hf. Furthermore, in the present fluorescent material having the composition represented by the formula (I), a part of O and N may be substituted with fluorine (F).

The present fluorescent material has, as the host crystal, a crystal structure identical with the crystal structure of the inorganic compound represented by $Si_{2.24}Al_{10.76}O_{0.76}N_{13.24}$, and there may be a case where when in the composition represented by the formula (I): $Si_uEu_vAl_wO_xN_y$, the constitutional element(s) is substituted with other element(s), or an activating element is solid-solved in a part of the constitutional elements, a change is generated in the lattice constant or atom position. Even in the case where the lattice constant or atom position is changed, it may be considered that the crystal structure, the site occupied by the atom, and the atom position given by the coordinates do not largely change to such an extent that the chemical bond between the skeleton atoms is cleaved. The lattice constant, the space group, and the atomic coordinates can be determined by the analysis method by means of the X-ray diffractometry.

As a result of analyzing the present fluorescent material by the X-ray diffractometry, in the case where the lattice constants are values satisfying the foregoing formulae (i) to (iii), the space group belongs to the Cmcm space group, and the lengths (inter atomic distances) of chemical bonds of Al—N and Si—N as calculated from the atomic coordinates are close to the lengths of chemical bonds as calculated from the atomic coordinates of the crystal of the inorganic compound represented by $Si_{2.24}Al_{10.76}O_{0.76}N_{13.24}$ as shown in Table 1, the present fluorescent material can be identified to be a crystal structure identical with $Si_{2.24}Al_{10.76}O_{0.76}N_{13.24}$.

Meanwhile, in the present fluorescent material, in the case where the solid solution amount of Eu is small, the crystal structure of the present fluorescent material can also be specified without calculating the lattice constants or the inter atomic distances of Al—N and Si—N. As for the present fluorescent material, in the case where in the X-ray diffraction pattern, a peak is existent at the Bragg angle (2θ) in a substantially identical position of the main peak in the X-ray diffraction pattern as calculated from the crystal structure of the inorganic compound represented by $Si_{2.24}Al_{10.76}O_{0.76}N_{13.24}$, the present fluorescent material is identified to have, as a host crystal, a crystal structure identical with the inorganic compound represented by $Si_{2.24}Al_{10.76}O_{0.76}N_{13.24}$.

In the present fluorescent material, Si is an element serving as a skeleton constituting the crystal structure. In order to have, as a host crystal, a crystal structure identical with a novel crystal structure of the inorganic compound represented by $Si_{2.24}Al_{10.76}O_{0.76}N_{13.24}$, in the fluorescent material having the composition represented by the formula (I), when in the formula (I), the sum of the parameter u and the parameter w is taken as 13, the number of the parameter u representing a molar ratio of Si is a number satisfying a relation of (2.77≤u≤2.88). In the fluorescent material having the composition represented by the formula (I), when the number of u representing the molar ratio of Si is less than 2.77 or more than 2.88, the crystal structure may change, so that the resultant is not a fluorescent material having a desired light emission intensity.

In the present fluorescent material, Eu is an activating element serving as a light emitting center. In order to obtain a high light emission intensity, in the composition represented by the formula (I), when in the formula (I), the sum of the parameter u and the parameter w is taken as 13, the parameter v representing a molar ratio of Eu is a number satisfying a relation of (0.04≤v≤0.08). In the composition represented by the formula (I), when the number of the parameter v representing the molar ratio of Eu is less than 0.04, the amount of the activating element is too small, so that a high light emission intensity cannot be obtained, whereas when the number of the parameter v is more than 0.08, the amount of the activating element is too large, so that concentration quenching is generated, and a high light emission intensity cannot be obtained.

In the present fluorescent material, Al is an element serving as a skeleton constituting the crystal structure. In order to have, as a host crystal, a crystal structure identical with a novel crystal structure of the inorganic compound represented by $Si_{2.24}Al_{10.76}O_{0.76}N_{13.24}$, when in the formula (I), the sum of the parameter u and the parameter w is taken as 13, the number of the parameter w representing a molar ratio of Al is a number satisfying a relation of ($10.12 \leq w \leq 10.23$). In the formula (I), when the number of the parameter w representing the molar ratio of Al is less than 10.12 or more than 10.23, the crystal structure may change, so that the resultant is not a fluorescent material having a desired light emission intensity.

A part of the nitrogen (N) atom or the oxygen (O) atom in the composition represented by the formula (I) may be substituted with a fluorine (F) atom. Even in this case, in the case where the main component is represented by the formula (I), namely in the case where when in the formula (I), the sum of the parameter u and the parameter w is taken as 13, a molar ratio of fluorine is in a range of 0.01 or more and 0.41 or less, it should be construed that the subject fluorescent material is included in the formula (I).

As for the present fluorescent material, it is preferred that a molar ratio of silicon to aluminum (Si/Al ratio) in the composition represented by the formula (I) is in a range of 0.20 or more and 0.30 or less, and a molar ratio of oxygen to nitrogen (O/N ratio) is in a range of 0.01 or more and 0.08 or less. In the present specification, the molar ratio of silicon to aluminum (Si/Al ratio) and the molar ratio of oxygen to nitrogen (O/N ratio) in the fluorescent material are calculated based on the results of the composition analysis of the present fluorescent material. The Si/Al ratio of the present fluorescent material is more preferably in a range of 0.25 or more and 0.29 or less. In addition, the O/N ratio of the present fluorescent material is more preferably in a range of 0.03 or more and 0.07 or less.

In the present fluorescent material, when the molar ratio of silicon to aluminum (Si/Al ratio) falls within the aforementioned range, and the molar ratio of oxygen to nitrogen (O/N ratio) falls within the aforementioned range, the present fluorescent material has, as a host crystal, a crystal structure identical with a novel crystal structure of the inorganic compound represented by $Si_{2.24}Al_{10.76}O_{0.76}N_{13.24}$, and a high light emission intensity is obtained.

As for the present fluorescent material, in the case where in the X-ray diffraction pattern by CuKα rays, the intensity of the diffraction peak at a Bragg angle (2θ) in a range of 35.4° or more and 36.0° or less is taken as 100%, it is preferred to include a crystal phase in which a relative intensity of a diffraction peak at a Bragg angle (2θ) in a range of 33.0° or more and 33.6° or less is 10% or more and 45% or less, a relative intensity of a diffraction peak at a Bragg angle (2θ) in a range of 37.6° or more and 38.2° or less is 8% or more and 24% or less, a relative intensity of a diffraction peak at a Bragg angle (2θ) in a range of 59.8° or more and 60.4° or less is 3% or more and 30% or less, and a relative intensity of a diffraction peak at a Bragg angle (2θ) in a range of 60.5° or more and 61.1° or less is 6% or more and 32% or less.

As for the present fluorescent material, in the case where in the X-ray diffraction pattern by CuKα rays, the intensity of the diffraction peak at a Bragg angle (2θ) in a range of 35.4° or more and 36.0° or less is taken as 100%, in the case of including a crystal phase in which the diffraction peaks, each having the Bragg angle (2θ) in each of the aforementioned ranges, have relative intensities of the aforementioned ranges, the present fluorescent material has, as a host crystal, a crystal structure identical with the inorganic compound represented by $Si_{2.24}Al_{10.76}O_{0.76}N_{13.24}$, and a high light emission intensity is obtained.

As for the present fluorescent material, in the case where in the X-ray diffraction pattern by CuKα rays, the intensity of the diffraction peak at a Bragg angle (2θ) in a range of 35.4° or more and 36.0° or less is taken as 100%, it is more preferred to include a crystal phase in which a relative intensity of a diffraction peak at a Bragg angle (2θ) in a range of 33.0° or more and 33.6° or less is 11% or more and 43% or less, a relative intensity of a diffraction peak at a Bragg angle (2θ) in a range of 37.6° or more and 38.2° or less is 8% or more and 22% or less, a relative intensity of a diffraction peak at a Bragg angle (2θ) in a range of 59.8° or more and 60.4° or less is 5% or more and 28% or less, and a relative intensity of a diffraction peak at a Bragg angle (2θ) in a range of 60.5° or more and 61.1° or less is 7% or more and 32% or less.

The present fluorescent material absorbs light in a region at the short wavelength side of from ultraviolet rays to visible light and has a light emission peak wavelength at the longer wavelength side than a light emission peak wavelength of excited light. Specifically, the present fluorescent material is excited by a light from an excitation light source having a light emission peak wavelength in a wavelength range of 260 nm or more and 460 nm or less, thereby emitting a blue to blue-green fluorescence in a wavelength range of 480 nm or more and 490 nm or less, as shown in the light emission spectrum of FIG. 5.

Figure 6:
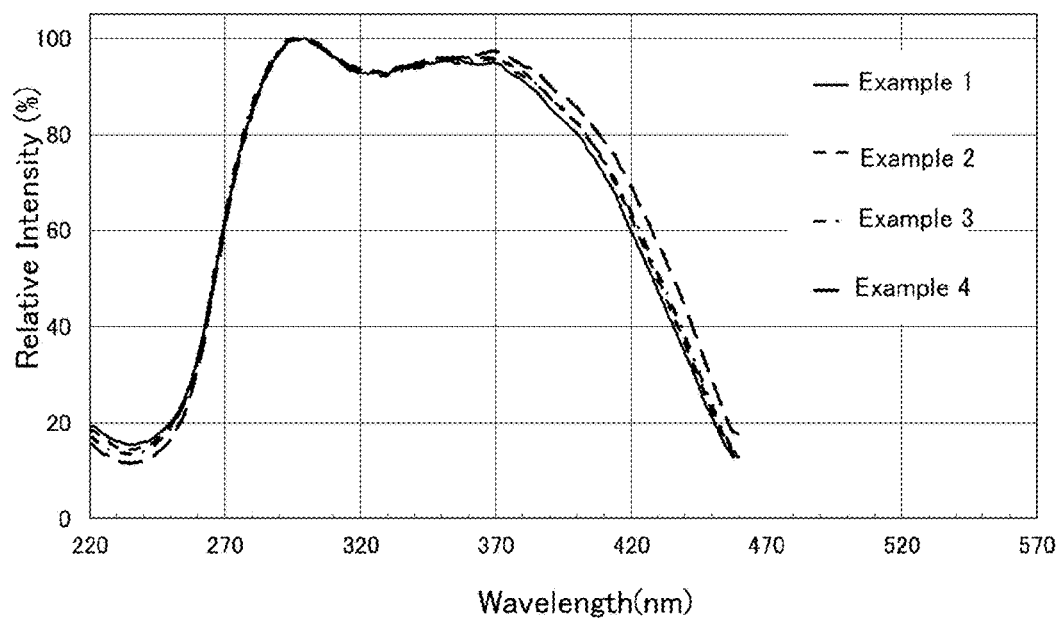
FIG. 6 is a graph showing excitation spectra of fluorescent materials of Examples 1 to 4.

By using an excitation light source having a light emission peak wavelength in a wavelength range of 270 nm or more and 430 nm or less, as shown in the excitation spectrum of FIG. 6, the excitation spectrum of the present fluorescent material shows a relatively high intensity in the foregoing wavelength range, and therefore, the light emission efficiency of the present fluorescent material can be enhanced. In particular, it is preferred to use an excitation light source having a light emission peak wavelength in a range of 280 nm or more and 410 nm or less, and it is more preferred to use an excitation light source having a light emission peak wavelength in a range of 290 nm or more and 380 nm or less.

The present fluorescent material is preferably particles having an average particle diameter in a range of 0.1 μm or more and 50.0 μm or less. The present fluorescent material can be formed into particles having an average particle diameter in a range of 0.1 μm or more and 50.0 μm or less through grinding and optionally, dispersion and filtration. As for the present fluorescent material, the average particle diameter of the particles is more preferably in a range of 0.5 μm or more and 40.0 μm or less, still more preferably in a range of 1.0 μm or more and 30.0 μm or less, and yet still more preferably in a range of 2.0 μm or more and 25.0 μm or less. It is preferred that the present fluorescent material contains particles having an average particle diameter falling within the aforementioned range at a high frequency. In addition, it is preferred that a particle size distribution of the particles of the present fluorescent material is in a narrow range. By including particles having a large particle diameter, low heterogeneity of the particle diameter and have a high light emission intensity, a light emitting device having more reduced color unevenness and a good color tone is obtained. The fluorescent material having a particle diameter falling within the aforementioned range is able to keep the light absorptivity and conversion efficiency high. A fluorescent material having an average particle diameter of smaller than 1.0 µm tends to form an agglomerate.

In the present specification, the "average particle diameter" means an average particle diameter measured by a particle measurement method utilizing electrical resistance on a basis of the Coulter theory. Specifically, the particle diameter of the particle of the fluorescent material can be determined based on electrical resistance generated by dispersing the fluorescent material in a solution and allowing it to pass through pores of an aperture tube.

Second Embodiment

In the second embodiment, the method of producing a fluorescent material is described (the method will be also referred to as "present production method"). The present production method includes subjecting a raw material mixture including $EuF_3$ to a heat treatment to obtain a fluorescent material including a composition represented by formula (I): $Si_uEu_vAl_wO_xN_y$, wherein when the sum of a parameter u and a parameter w is taken as 13, parameters u, v, w, x, and y in the formula (I) are values satisfying the ranges represented by the foregoing formulae (1) to (5), respectively.

The raw materials for producing the fluorescent material are $EuF_3$ and a compound including any one of the elements constituting the composition represented by the formula (I), and the respective raw materials are weighed so as to attain a target composition ratio (molar ratio). Examples of the compound including the element constituting the composition represented by the formula (I) include a compound including Si and a compound including Al.

Raw Materials

Specific raw materials for producing the fluorescent material are described. As the compound including Si, a metal of Si alone or a compound of Si, such as an oxide, an imide, an amide, a nitride, and various salts, can be used as the raw material. Specifically, $Si_3N_4$, $SiO_2$, and so on can be used. In addition, a compound including other element which is included in the composition represented by the formula (I) and Si may also be used. In addition, as the raw material, it is preferred to use the compound including Si in which a purity of Si is 3N or more. As for the compound including Si, a compound including, in addition to Si, a different element, such as Li, Na, K, B, and Cu, may be used as the raw material. Furthermore, a compound including, in addition to Si, at least one element selected from the group consisting of Al, Ga, In, Ge, Sn, Ti, Zr, and Hf may be used. In the case of using this compound, there may be a case where a part of Si is substituted with at least one element selected from the group consisting of Al, Ga, In, Ge, Sn, Ti, Zr, and Hf.

As the compound including Al, a metal of Al alone or a compound of Al, such as an oxide, an imide, an amide, a nitride, and various salts, can be used as the raw material. Specifically, AlN, $Al_2O_3$, and so on can be used. In addition, a compound including other element which is included in the composition represented by the formula (I) and Al may also be used. In addition, as the raw material, it is preferred to use the compound including Al in which a purity of Al is 3N or more. As for the compound including Al, a compound including, in addition to Al, a different element, such as Li, Na, K, B, and Cu, may be used as the raw material. Furthermore, a compound including, in addition to Al, Ga and/or In may be used. In the case of using this compound, there may be a case where a part of Al is substituted with at least one element selected from Ga and In.

As the compound including Eu, $EuF_3$ may be used. As a part of the compound including Eu, $Eu_2O_3$ may also be used in place of $EuF_3$. By using $EuF_3$ as the raw material not only Eu in a desired molar ratio can be solid-solved in the crystal structure, but also it can be allowed to function as a flux as described later.

An average particle diameter of each of the raw materials is in a range of preferably about 0.1 µm or more and 15 µm or less, and in a range of more preferably about 0.1 µm or more and 10 µm or less from the viewpoints of reactivity with other raw material, particle diameter control at the time of heat treatment and after the heat treatment, and so on. In the case where the raw material has a particle diameter of more than this range, the aforementioned average particle diameter can be achieved by undergoing grinding within a glove box in an argon atmosphere or a nitrogen atmosphere.

Flux

In order to enhance the reactivity as the raw materials, the raw material mixture may include a flux, such as a halide and a phosphate, as the need arises. When the flux is contained in the raw material mixture, the reaction of the raw materials with each other is promoted, so that the solid-phase reaction is readily advanced more uniformly. As for a reason for this, it may be considered that the temperature at which the raw material mixture is heat treated is substantially the same as the production temperature of a liquid phase of the halide to be used as the flux, or is a temperature higher than the production temperature of the aforementioned liquid phase, and therefore, the reaction is promoted.

Examples of the compound which is used as the flux include fluorides, chlorides, or phosphates of an alkaline earth metal, an alkali metal, or $NH_3$. Specifically, examples of the compound which is used as the flux include fluorides, chlorides, or phosphates including at least one element selected from the group consisting of Li, Na, Cs, Rb, Mg, Ca, Sr, Ba, and $NH_3$.

The content of the flux of the raw material mixture resulting from mixing of the raw materials is preferably 10% by mass or less, more preferably 5% by mass or less, and still more preferably 2% by mass or less, and preferably 0.1% by mass or more on a basis of the raw material mixture (100% by mass). When the content of the flux falls within the aforementioned range, the particle growth is promoted, whereby the fluorescent material composed of the target crystal phase can be formed.

Mixing of Raw Materials $EuF_3$ is mixed with, for example, the compound including Si and the compound including Al to obtain the raw material mixture. In the composition represented by the formula (I): $Si_uEu_vAl_wO_xN_y$, it is preferred to mix the compound including Si and the compound including Al such that a molar ratio of silicon to aluminum (Si/Al ratio) is in a range of 0.20 or more and 0.30 or less. In the composition represented by the formula (I), by mixing the compound including Si and the compound including Al such that a molar ratio of silicon to aluminum (Si/Al ratio) is in a range of 0.20 or more and 0.30 or less, the fluorescent material including a crystal structure identical with a novel crystal structure of the inorganic compound represented by $Si_{2.24}Al_{10.76}O_{0.76}N_{13.24}$, and a high light emission intensity is obtained. The molar ratio of silicon to aluminum (Si/Al ratio) in the composition represented by the formula (I) is more preferably in a range of 0.25 or more and 0.29 or less.

In the composition represented by the formula (I): $Si_uEu_vAl_wO_xN_y$, it is preferred to mix the compound including and the compound including N such that a molar ratio of oxygen to nitrogen (O/N ratio) is in a range of 0.01 or more and 0.08 or less. Specifically, it is preferred to use, as raw materials, $Si_3N_4$, $SiO_2$, AlN, and $Al_2O_3$ and then mix the respective compounds such that a molar ratio of $SiO_2$ to $Si_3N_4$ and/or a molar ratio of $Al_2O_3$ to AlN is adjusted so that the molar ratio of oxygen to nitrogen (O/N ratio) is in a range of 0.01 or more and 0.08 or less. In the composition represented by the formula (I), by mixing the respective compounds such that the molar ratio of oxygen to nitrogen (O/N ratio) is in a range of 0.01 or more and 0.08 or less, the fluorescent material including, as the host crystal, a crystal structure identical with a novel crystal structure of the inorganic compound represented by $Si_{2.24}Al_{10.76}O_{0.76}N_{13.24}$, and a high light emission intensity is obtained. The molar ratio of oxygen to nitrogen (O/N ratio) in the composition represented by the formula (I) is more preferably in a range of 0.01 or more and 0.06 or less.

The respective compounds serving as the raw materials are uniformly mixed in a wet or dry manner using a mixing machine, thereby obtaining a raw material mixture. Besides a ball mill which is commonly used in industrial processes, a grinder, such as a vibration mill, a roll mill, and a jet mill, can be used as the mixing machine. In addition, in order to allow a specific surface area of the powder to fall within a fixed range, classification can also be performed using a wet separator, such as a sedimentation tank, a hydro cyclone (liquid cyclone), and a centrifugal separator, or a dry classifier, such as a cyclone and an air separator, each of which is commonly used in industrial processes.

Heat Treatment

The raw material mixture is placed in a crucible, a cylindrical vessel, or a plate-shaped boat, each of which is made of a material, such as SiC, quartz, alumina, and boron nitride, followed by performing a heat treatment. For the heat treatment, an electric furnace, a tubular furnace, a small-sized furnace, a high-frequency furnace, or a metal furnace, each utilizing resistance heating, can be used.

The atmosphere for performing the heat treatment is preferably a reducing atmosphere with a flow of gas. Specifically, it is preferred to perform the heat treatment in a nitrogen atmosphere, a mixed atmosphere of nitrogen and hydrogen, an ammonia atmosphere, or a mixed atmosphere thereof (for example, a mixed atmosphere of nitrogen and ammonia).

The heat treatment temperature is preferably in a range of 1,200° C. or higher and 2,000° C. or lower, and more preferably in a range of 1,700° C. or higher and 1,900° C. or lower. In addition, the heat treatment time is preferably in a range of 2 hours or more and 200 hours or less, more preferably in a range of 5 hours or more and 150 hours or lower, and most preferably in a range of 8 hours or more and 150 hours or less.

Post-Treatment

The product obtained by heat treating the raw material mixture is a fluorescent material having the target composition. When this fluorescent material is subjected to grinding, dispersion, solid-liquid separation, classification, and drying, a fluorescent material powder having the target composition can obtained. The solid-liquid separation can be performed by a separation method which is commonly used in industrial processes, such as filtration, suction filtration, pressure filtration, centrifugation, and decantation. In addition, the classification can be performed by a method which is commonly used in industrial processes, such as a method using a dry classification machine, e.g., a cyclone, an air separator, etc., or by means of sieving. In addition, drying can be achieved by an apparatus or method which is commonly used in industrial processes, such as a vacuum dryer, a hot air heating dryer, a conical dryer, and a rotary evaporator.

Third Embodiment

In the third embodiment, the light emitting device is described (the device will be also referred to as "present light emitting device"). The present light emitting device includes the fluorescent material according to the first embodiment and an excitation light source.

The present excitation light source which is included in the light emitting device is preferably one which emits a light having a peak wavelength in a short wavelength region of from a near ultraviolet light to a visible light. The fluorescent material absorbs a part of light from the excitation light source to emit the light. The fluorescent material which is included in the present light emitting device may have, in addition to the fluorescent material according to the first embodiment (hereinafter also referred to as "first fluorescent material"), at least one fluorescent material (hereinafter also referred to as "second fluorescent material").

Figure 3:
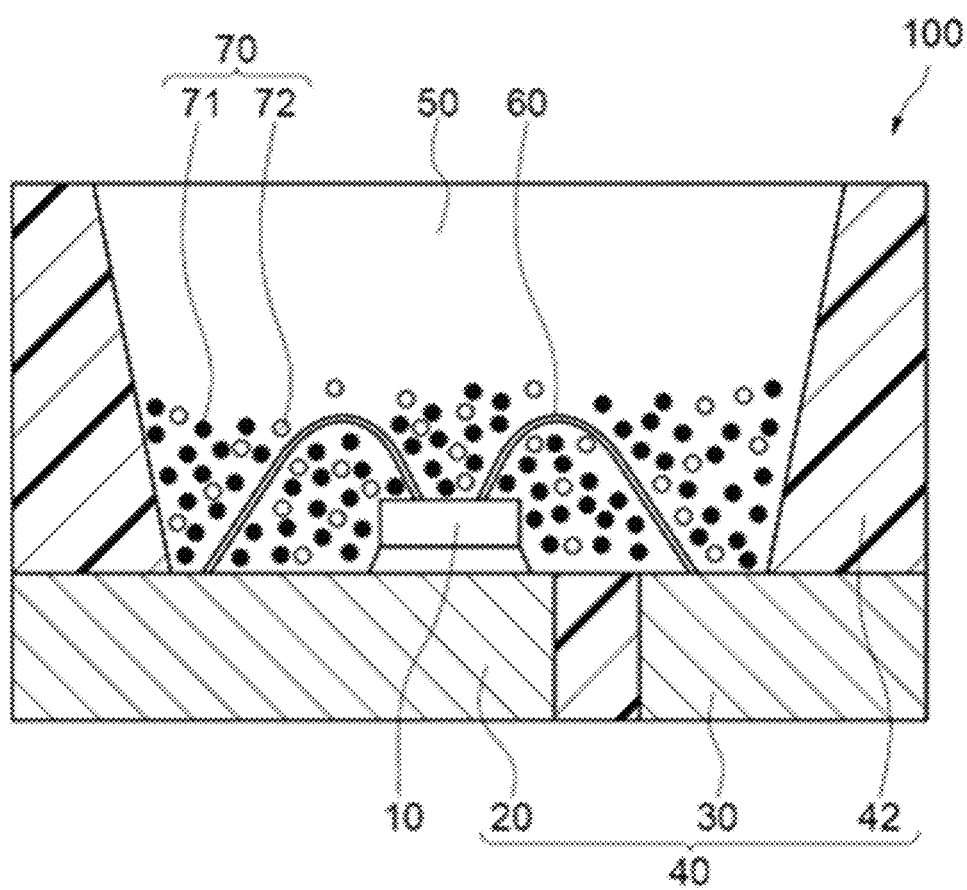
FIG. 3 is a diagrammatic cross-sectional view showing an example of a light emitting device.

The present light emitting device is described by reference to FIG. 3. FIG. 3 is a schematic cross-sectional view of the present light emitting device 100. The light emitting device 100 includes a molded body 40, a light emitting element 10, and a fluorescent member 50. The molded body 40 is one including a first lead 20, a second lead 30, and a resin part 42 including a thermoplastic resin or thermosetting resin, in which these are integrally molded. The molded body 40 has a concave part, and the light emitting element 10 is placed on the bottom of the concave part. The light emitting element 10 has a pair of positive and negative electrodes, and the pair of positive and negative electrodes is electrically connected with the first lead 20 and the second lead 30, respectively via a wire 60. The light emitting element 10 is covered by the fluorescent member 50. The fluorescent member 50 includes, for example, a fluorescent material 70 that undergoes wavelength conversion of a light from the light emitting element 10 and a resin. Furthermore, the fluorescent material 70 includes a first fluorescent material 71 and a second fluorescent material 72. In the first lead 20 and the second lead 30 connected with the pair of positive and negative electrodes of the light emitting element 10, a part of each of the first lead 20 and the second lead 30 is exposed from the resin part 42 toward the outside of a package constituting the light emitting device 100. When receiving supply of an electric power from the outside via these first lead 20 and second lead 30, it is possible to allow the light emitting device 100 to emit a light.

The members constituting the present light emitting device are hereunder described.

Light Emitting Element

The light emitting element 10 is able to be utilized as an excitation light source which emits a light from a UV region to a visible light region. The light emission peak wavelength of the light emitting element 10 is preferably in a range of 270 nm or more and 430 nm or less, more preferably in a range of 280 nm or more and 410 nm or less, and still more preferably in a range of 290 nm or more and 380 nm or less.

The fluorescent material 70 is efficiently excited by the light from the excitation light source having a light emission peak wavelength in the aforementioned range. The light emitting device 100 emits a color mixture light of a light from the light emitting element 10 and a light from the fluorescent material 70.

As for the light emitting element 10, for example, a semiconductor light emitting element using a nitride semiconductor ($In_xAl_yGa_{1-x-y}N$, $0 \leq x$, $0 \leq y$, $(x+y) \leq 1$). By using the semiconductor light emitting element, a stable light emitting device which is also strong against a mechanical impact can be obtained.

A full width at half maximum of the light emission spectrum of the light emitting element 10 can be, for example, set to 30 nm or less. By using the semiconductor light emitting element as the excitation light source, a stable light emitting device which is high in linearity of an output against an input with high efficiency and also strong against a mechanical impact can be obtained.

Fluorescent Member

The fluorescent member 50 includes the resin and the fluorescent material 70. It is preferred that the fluorescent material 70 include the first fluorescent material 71 and the second fluorescent material 72. As the first fluorescent material 71, the fluorescent material according to the first embodiment of the present invention can be used. The fluorescent material 70 may also be blended such that it is partially lopsided in the fluorescent member 50. The fluorescent member 50 also functions as a member for protecting the light emitting element 10 and the fluorescent material 70 from the external environment and as a wavelength converting member, too. When the fluorescent material 70 is arranged close to the light emitting element 10, it is able to undergo efficient wavelength conversion of the light from the light emitting element 10, and the light emitting device 100 that is excellent in the light emission efficiency can be provided. The arrangement of the fluorescent member 50 including the fluorescent material 70 and the light emitting element 10 is not limited to the mode where those are arranged close to each other. Considering influences on the fluorescent material 70 by heat, the light emitting element 10 can also be arranged spaced from the fluorescent member 50 including the fluorescent material 70. In addition, by mixing the fluorescent material 70 in the fluorescent member 50 in a substantially uniform proportion, a light free from color unevenness can also be obtained.

The total content of the fluorescent material 70 in the fluorescent member 50 can be, for example, set to 5 parts by mass or more to 300 parts by mass or less, preferably 10 parts by mass or more to 250 parts by mass or less, more preferably 15 parts by mass or more to 230 parts by mass or less, and still more preferably 15 parts by mass or more to 200 parts by mass or less relative to the resin (100 parts by mass). When the total content of the fluorescent material 70 in the fluorescent member 50 falls within the aforementioned range, the light emitted from the light emitting element 10 can be subjected to efficient wavelength conversion by the fluorescent material 70.

As for the fluorescent material 70, two or more fluorescent materials may be used. For example, the light emitting element 10 may be used in combination of the fluorescent material according to the first embodiment as the first fluorescent material 71 and the second fluorescent material 72 other than the first fluorescent material 71, which emits a red light. By using two or more fluorescent materials, a white light that is excellent in color reproducibility and color rendering properties can be obtained. As the second fluorescent material 72 which emits a red light, a nitride fluorescent material, such as $(Ca_{1-m}Sr_m)AlSiN_3$:Eu ($0 \leq m \leq 1.0$) or $(Ca_{1-m-n}Sr_mBa_n)_2Si_5N_8$:Eu ($0 \leq m \leq 1.0$ and $0 \leq n \leq 1.0$), or a fluoride fluorescent material, such as $K_2(Si_{1-m-n}Ge_mTi_n)F_6$:Mn ($0 \leq m \leq 1.0$ and $0 \leq n \leq 1.0$), can be used in combination with the first fluorescent material 71.

Besides, as the second fluorescent material which emits a red light, a nitride fluorescent material, such as $(Sr,Ca)LiAl_3N_4$:Eu; an Eu-activated acid sulfide fluorescent material, such as $(La,Y)_2O_2S$:Eu; an Eu-activated sulfide fluorescent material, such as $(Ca,Sr)S$:Eu; an Eu,Mn-activated halophosphate fluorescent material, such as $(Sr,Ca,Ba,Mg)_{10}(PO_4)_6Cl_2$:Eu,Mn; a Ce-activated oxide fluorescent material, such as $Lu_2CaMg_2(Si,Ge)_3O_{12}$:Ce; and an Eu-activated oxynitride fluorescent material, such as an α-type sialon, can be used.

The fluorescent material 70 can also include a green fluorescent material or a blue fluorescent material. By further adding a fluorescent material which emits a green light, or a fluorescent material which emits a blue light, each having a light emission peak wavelength different from the fluorescent material according to the first embodiment, the color reproducibility and color rendering properties can be more improved. In addition, by adding a fluorescent material which absorbs ultraviolet rays to emit a blue light, the color reproducibility and color rendering properties can also be improved through a combination with a light emitting device which emits ultraviolet rays in place of the light emitting element which emits a blue light.

As the fluorescent material which emits a green light, for example, a silicate fluorescent material, such as $(Ca,Sr,Ba)_2SiO_4$:Eu and $Ca_3Sc_2Si_3O_{12}$:Ce; a chlorosilicate fluorescent material, such as $Ca_8MgSi_4O_{16}Cl_2$:Eu,Mn; an oxynitride fluorescent material, such as $(Ca,Sr,Ba)_3Si_6O_9N_4$:Eu, $(Ca,Sr,Ba)_3Si_6O_{12}N_2$:Eu and $(Ca,Sr,Ba)Si_2O_2N_2$:Eu; an oxynitride fluorescent material, such as a β-sialon of $Si_{6-k}Al_kO_kN_{8-k}$:Eu ($0<k<4.2$); a Ce-activated aluminate fluorescent material, such as $(Y,Lu,Gd)_3(Al,Ga)_5O_{12}$:Ce; an Mn-activated aluminate fluorescent material, such as $(Ba,Sr,Ca)MgAl_{10}O_{17}$:Mn; an Eu-activated sulfide fluorescent material, such as $SrGa_2S_4$:Eu; and an oxide fluorescent material, such as $CaSc_2O_4$:Ce, can be used.

As the fluorescent material which emits a blue light, for example, an Eu-activated aluminate fluorescent material, such as $(Sr,Ca,Ba)Al_2O_4$:Eu, $(Sr,Ca,Ba)_4Al_{14}O_{25}$:Eu, $(Ba,Sr,Ca)MgAl_{10}O_{17}$:Eu, and $BaMgAl_{14}O_{25}$:Eu,Tb,Sm; an Eu,Mn-activated aluminate fluorescent material, such as $(Ba,Sr,Ca)MgAl_{10}O_{17}$:Eu,Mn; a Ce-activated thiogallate fluorescent material, such as $SrGa_2S_4$:Ce and $CaGa_2S_4$:Ce; an Eu-activated silicate fluorescent material, such as $(Ba,Sr,Ca,Mg)_2SiO_4$:Eu; an Eu-activated halophosphate fluorescent material, such as $(Sr,Ca,Ba,Mg)_{10}(PO_4)_6Cl_2$:Eu; and an Eu-activated silicate fluorescent material, such as $(Ca,Sr,Ba)_3MgSi_2O_8$:Eu, can be used.

The fluorescent member 50 containing the fluorescent material 70 is formed so as to cover the light emitting element 10 placed within the concave part of the molded body 40. Taking into consideration easiness of production, as the resin which is included in the fluorescent member 50, a silicone resin, an epoxy resin, or an acrylic resin can be used. In addition, besides the fluorescent material 70 is contained in the fluorescent member 50, for example, a filler, a light diffusing material, or the like may be further properly contained. For example, when the fluorescent member 50 includes the light diffusing material, directivity from the light emitting element 10 can be relieved, thereby increasing a viewing angle. Examples of the filler or light diffusing material may include silica, titanium oxide, and alumina. In the case where the fluorescent member 50 includes a filler, the content of the filler can be, for example, set to 1 part by mass or more to 20 parts by mass or less based on 100 parts by mass of the resin.

EXAMPLES

The present invention will now be described in detail with reference to examples, but the present invention is not limited to these examples.

Examples 1 to 9 and Comparative Examples 1 to 7

Using, as raw materials, europium fluoride (EuF$_3$), an α-type silicon nitride (Si$_3$N$_4$) powder, an aluminum nitride (AlN) powder, and an aluminum oxide (Al$_2$O$_3$) powder, the respective compounds working as the raw materials were mixed such that a raw material composition ratio (molar ratio) of each of the Examples and Comparative Examples was a value as shown in Table 2, thereby obtaining a raw material mixture. The raw material composition ratio (molar ratio) shown in Table 2 was calculated while defining the aluminum (Al) as 7. As for only the raw materials in Comparative Example 7, europium oxide (Eu$_2$O$_3$) was used without using the europium fluoride (EuF$_3$).

This raw material mixture was filled in a cylindrical boron nitride vessel. The raw material mixture was subjected to temperature rise to 2,000° C. under a pressure of 0.9 MPa by using an electric furnace of a graphite resistance heating system while introducing nitrogen into the electric furnace, and the raw material mixture was subjected to a heat treatment by keeping at that temperature for 2 hours, thereby obtaining a fluorescent material. The resulting fluorescent material was ground by an aluminum mortar and then allowed to pass through a sieve in such a manner that the average particle diameter was in a range of 5.0 μm or more and 20.0 μm or less, thereby obtaining a fluorescent material powder. The fluorescent materials of Examples 1 to 9 and Comparative Example 1 have the target composition and have, as a host crystal, an essentially identical crystal structure, and composed of the target crystal phase. In the fluorescent materials of Comparative Examples 2 and 6, a sub phase that is a crystal structure different from the inorganic compound having the target crystal phase was also included. In the fluorescent material of Comparative Example 3, a crystal structure (crystal phase of other compound) of a compound having other composition that is different from the target composition was formed. The fluorescent material powders were observed with a scanning electron microscope (SEM), thereby confirming that the average particle diameter was in a range of 5.0 μm or more and 20.0 μm or less.

The following Table 2 shows the raw material composition ratio (molar ratio) of each of the fluorescent materials of Examples 1 to 9 and Comparative Examples 1 to 7, the raw material molar ratio of silicon to aluminum (Si/Al ratio), and the raw material molar ratio of oxygen to nitrogen (O/N ratio).

TABLE 2

| | Eu raw material | Raw material composition ratio (molar ratio) | | | | | | Raw material molar ratio | |
| | | Si | Eu | Al | O | N | F | Si/Al ratio | O/N ratio |
|---|---|---|---|---|---|---|---|---|---|
| Comparative Example 1 | EuF$_3$ | 2.00 | 0.05 | 7.00 | 0.00 | 9.67 | 0.15 | 0.29 | 0.00 |
| Example 1 | | 2.00 | 0.05 | 7.00 | 0.10 | 9.60 | 0.15 | 0.29 | 0.01 |
| Example 2 | | 2.00 | 0.05 | 7.00 | 0.20 | 9.54 | 0.15 | 0.29 | 0.02 |
| Example 3 | | 2.00 | 0.05 | 7.00 | 0.30 | 9.47 | 0.15 | 0.29 | 0.03 |
| Example 4 | | 2.00 | 0.05 | 7.00 | 0.59 | 9.28 | 0.15 | 0.29 | 0.06 |
| Comparative Example 2 | | 2.00 | 0.05 | 7.00 | 0.90 | 9.07 | 0.15 | 0.29 | 0.10 |
| Comparative Example 3 | | 0.80 | 0.05 | 7.00 | 0.40 | 7.80 | 0.15 | 0.11 | 0.05 |
| Comparative Example 4 | | 1.20 | 0.05 | 7.00 | 0.60 | 8.20 | 0.15 | 0.17 | 0.07 |
| Comparative Example 5 | | 1.60 | 0.05 | 7.00 | 0.80 | 8.60 | 0.15 | 0.23 | 0.09 |
| Comparative Example 6 | | 2.00 | 0.05 | 7.00 | 1.00 | 9.00 | 0.15 | 0.29 | 0.11 |
| Example 5 | | 2.00 | 0.03 | 7.00 | 0.59 | 9.28 | 0.09 | 0.29 | 0.06 |
| Example 6 | | 2.00 | 0.05 | 7.00 | 0.59 | 9.28 | 0.15 | 0.29 | 0.06 |
| Example 7 | | 2.00 | 0.07 | 7.00 | 0.59 | 9.28 | 0.21 | 0.29 | 0.06 |
| Example 8 | | 2.00 | 0.09 | 7.00 | 0.59 | 9.28 | 0.27 | 0.29 | 0.06 |
| Example 9 | | 2.00 | 0.05 | 7.00 | 0.59 | 9.28 | 0.15 | 0.29 | 0.06 |
| Comparative Example 7 | Eu$_2$O$_3$ | 2.00 | 0.05 | 7.00 | 0.59 | 9.23 | 0.00 | 0.29 | 0.06 |

The fluorescent materials of Examples 1 to 9 and Comparative Examples 1 to 7 were evaluated as follows.

Composition Analysis

In the fluorescent material of each of the Examples and Comparative Examples, with respect to Eu and Al, quantitative analysis of elements constituting the composition was performed with an inductively coupled plasma atomic emission spectroscope (ICP-AES, manufactured by PerkinElmer Inc.). With respect to Si, weight analysis and quantitative analysis with ICP-AES were performed. With respect to O and N, quantitative analysis was performed with an oxygen/nitrogen analyzer (manufactured by Horiba, Ltd.). With respect to F, quantitative analysis was performed with an ion chromatograph (manufactured by Dionex Corporation).

The analysis condition of the ion chromatography is as follows.

Column: IonPack AS12 (4 mm)
Eluting solution: 2.7 mM Na$_2$CO$_3$+0.3 mM NaHCO$_3$
Suppressor: Yes
Column temperature: 35° C.
Detection: Electrical conductivity detector The results of the quantitative analysis of elements constituting the fluorescent material of each of the Examples and Comparative Examples are shown in Table 3. The value of the composition ratio (molar ratio) of each of the fluorescent materials of the Examples and Comparative Examples as shown in Table 3 is a value calculated from the analysis results while defining the sum of the molar ratio of Si and the molar ratio of Al as 13.00.

X-Ray Diffraction Analysis

Figure 4:
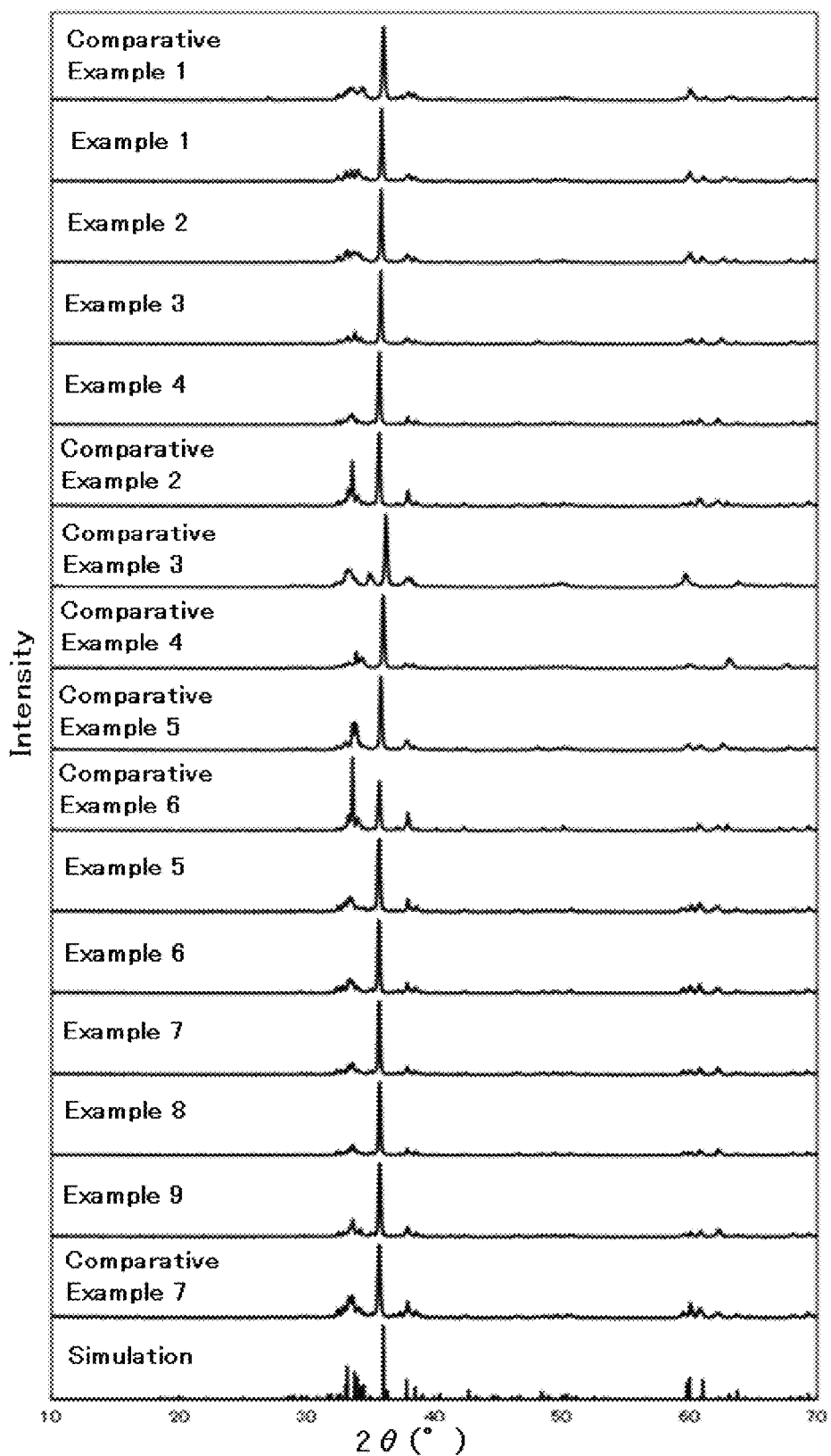
FIG. 4 is a graph showing an X-ray diffraction simulation pattern using CuKα rays as calculated from a crystal structure of an inorganic compound represented by $Si_{2.24}Al_{10.76}O_{0.76}N_{13.24}$ and X-ray diffraction patterns using CuKα rays of fluorescent materials of Examples 1 to 9 and Comparative Examples 1 to 7.

With respect to each of the resulting fluorescent materials, an X-ray diffraction spectrum (XRD) was measured. The measurement was performed with a multipurpose, fully-automated horizontal X-ray diffractometer (a product name: SmartLab, manufactured by Rigaku Corporation) using CuKα rays. With respect to the fluorescent material of each of the Examples and Comparative Examples, the resulting X-ray diffraction pattern was compared with the X-ray diffraction simulation pattern as calculated from the crystal structure of the inorganic compound represented by $Si_{2.24}Al_{10.76}O_{0.76}N_{13.24}$ as shown in FIG. 2, thereby confirming whether or not each of the fluorescent materials of Examples 1 to 9 and Comparative Examples 1 to 7 has, as a host crystal, a crystal structure identical with the crystal of the inorganic compound represented by $Si_{2.24}Al_{10.76}O_{0.76}N_{13.24}$ and is composed of the target crystal phase. The X-ray diffraction pattern of each of the fluorescent materials is shown in FIG. 4. In addition, the results of crystal phase analysis (the target crystal phase, or the sub phase, etc.) of the powder X-ray diffraction are shown in Table 4. In addition, in the X-ray diffraction pattern, in the case of defining a peak of maximum intensity as 100%, relative intensities (%) of diffraction peaks in which the Bragg angle (2θ) in a range of 33.0° or more and 33.6° or less, 35.4° or more and 36.0° or less, 37.6° or more and 38.2° or less, 59.8° or more and 60.4° or less, and 60.5° or more and 61.1° or less, respectively are shown in Table 5. In the fluorescent materials of Examples 1 to 9, the fluorescent materials of Comparative Examples 2, 5, and 7, and the inorganic compound represented by $Si_{2.24}Al_{10.76}O_{0.76}N_{13.24}$, the maximum intensity of the X-ray diffraction pattern was present at the Bragg angle (2θ) in a range of 35.4° or more and 36.0° or less; however, in the fluorescent materials of Comparative Examples 1, 3, 4, and 6, the maximum intensity of the X-ray diffraction pattern was not existent at the Bragg angle (2θ) in a range of 35.4° or more and 36.0° or less.

Evaluation of Light Emitting Properties

Measurement of Light Emission Spectrum

Figure 5:
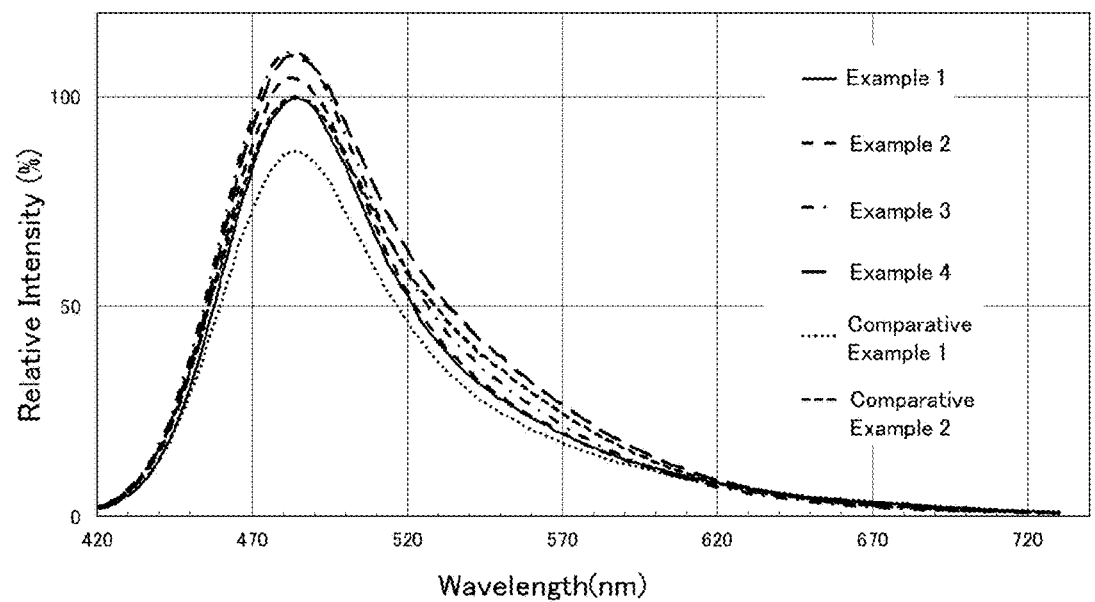
FIG. 5 is a graph showing light emission spectra of fluorescent materials of Examples 1 to 4 and Comparative Examples 1 and 2.

With respect to the fluorescent material of each of the Examples and Comparative Examples, a light having an excitation wavelength of 400 nm was irradiated on the respective fluorescent material by using a fluorescence spectrophotometer (F-4500, manufactured by Hitachi High-Technologies Corporation), and a light emission spectrum in a range of 420 nm or more and 740 nm or less was measured at room temperature (25° C.±5° C.). With respect to the light emission spectrum of each of the Examples and Comparative Examples, a relative light emission peak intensity while defining a light emission peak intensity of the fluorescent material of Comparative Example 2 as 100%, is shown in Table 4. In addition, the light emission spectrum showing the relative intensity (%) at each wavelength of each of the fluorescent materials of Examples 1 to 4 and the fluorescent materials of Comparative Examples 1 to 2 while defining the light emission peak intensity of the fluorescent material of Comparative Example 2 as 100%, is shown in FIG. 5.

Measurement of Excitation Spectrum

With respect to the fluorescent material of each of the Examples and Comparative Examples, an excitation spectrum in a range of 220 nm or more and 570 nm or less was measured at room temperature (25° C.±5° C.) at respective light emission wavelengths of each of the fluorescent materials by using a fluorescence spectrophotometer (F-4500, manufactured by Hitachi High-Technologies Corporation). An excitation spectrum showing the relative intensity (%) at each wavelength while defining a maximum intensity of respective excitation spectra of each of the fluorescent materials of Examples 1 to 4 as 100%, is shown in FIG. 6. In addition, in each of the fluorescent materials, a relative intensity at 400 nm is shown as an excitation rate in Table 4.

Measurement of Reflection Spectrum

Figure 7:
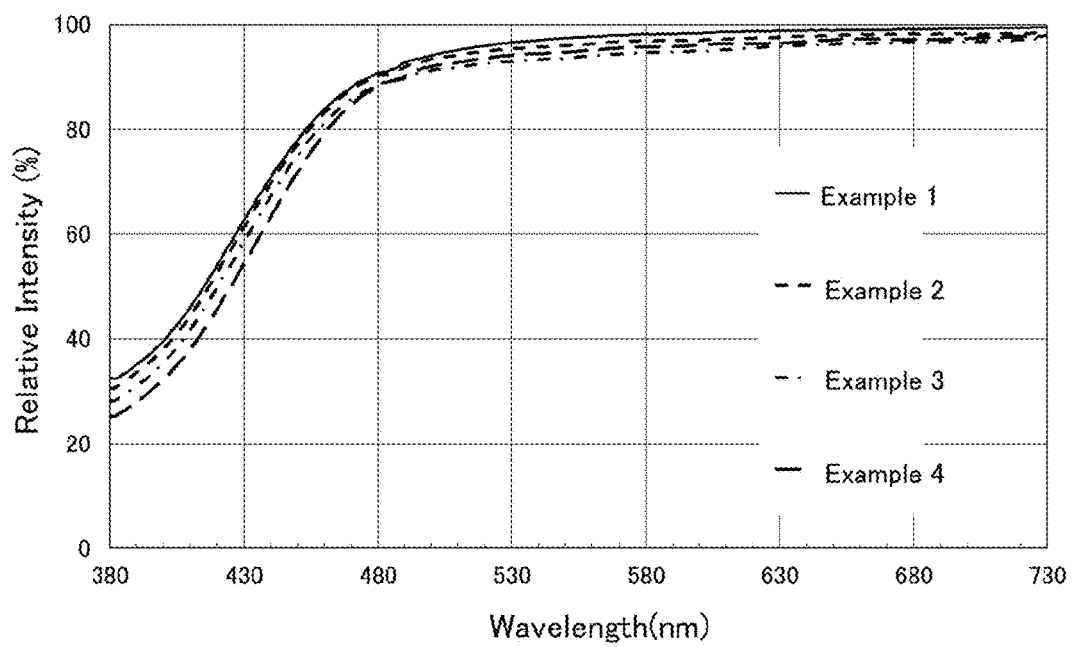
FIG. 7 is a graph showing reflection spectra of fluorescent materials of Examples 1 to 4.

With respect to the fluorescent material of each of the Examples and Comparative Examples, a reflection spectrum in a range of 380 nm or more and 730 nm or less was measured at room temperature (25° C.±5° C.) by using a fluorescence spectrophotometer (F-4500, manufactured by Hitachi High-Technologies Corporation). Calcium hydrogen phosphate ($CaHPO_4$) was used for a standard sample. With respect to the reflection spectrum of each of the fluorescent materials of Examples 1 to 4, the reflection spectrum showing a relative intensity (reflectance) (%) in the case of defining a reflectance of the standard sample at each wavelength as 100%, is shown in FIG. 7. In addition, in each of the fluorescent materials, the relative intensity at 400 nm is shown in terms of an absorptivity in Table 4.

SEM Image

Figure 8:
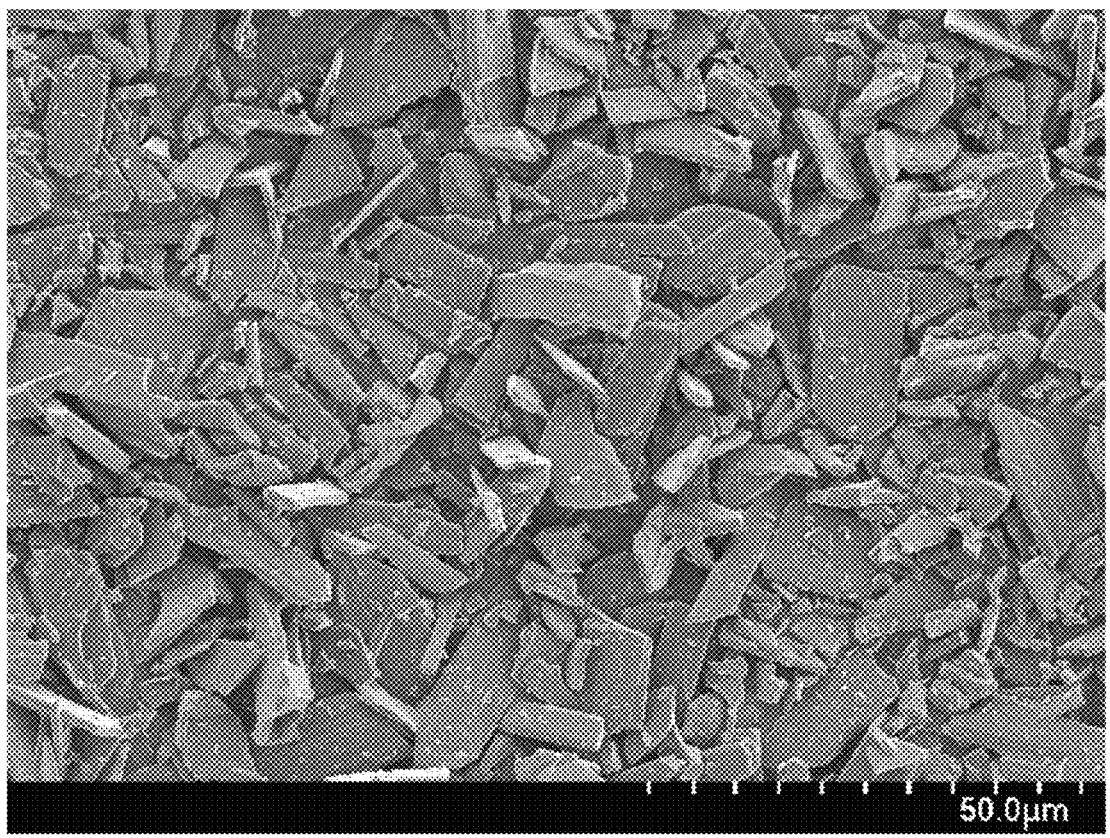
FIG. 8 is an SEM micrograph of a fluorescent material of Example 1.
Figure 9:
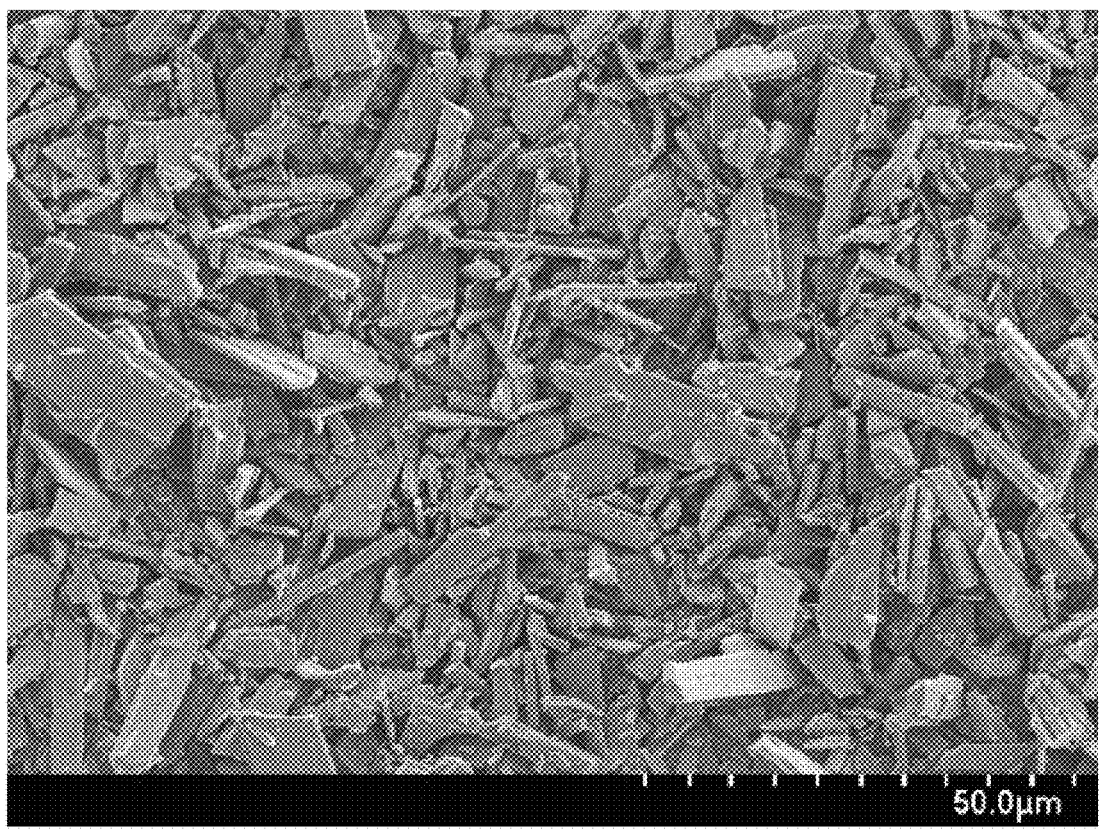
FIG. 9 is an SEM micrograph of a fluorescent material of Comparative Example 1.

An SEM micrograph of each of the fluorescent materials of Examples 1 and 2 and the fluorescent material of Comparative Example 1 was obtained using a scanning electron microscope (SEM). FIG. 8 is an SEM micrograph of the fluorescent material of Example 1, and FIG. 9 is an SEM micrograph of the fluorescent material of Comparative Example 1.

TABLE 3

| | Composition ratio (molar ratio) | | | | | | Molar ratio | |
| --- | --- | --- | --- | --- | --- | --- | --- | --- |
| | Si | Eu | Al | O | N | F | Si/Al ratio | O/N ratio |
| Comparative Example 1 | 2.83 | 0.06 | 10.17 | 0.31 | 13.69 | 0.00 | 0.28 | 0.02 |
| Example 1 | 2.81 | 0.06 | 10.19 | 0.42 | 13.65 | 0.00 | 0.28 | 0.03 |
| Example 2 | 2.81 | 0.06 | 10.19 | 0.52 | 13.63 | 0.00 | 0.28 | 0.04 |
| Example 3 | 2.85 | 0.06 | 10.15 | 0.64 | 13.31 | 0.00 | 0.28 | 0.05 |
| Example 4 | 2.77 | 0.06 | 10.23 | 0.87 | 13.04 | 0.00 | 0.27 | 0.07 |
| Comparative Example 2 | 2.81 | 0.06 | 10.19 | 1.21 | 12.80 | 0.00 | 0.28 | 0.09 |
| Comparative Example 3 | 1.18 | 0.05 | 11.82 | 0.78 | 12.84 | 0.00 | 0.10 | 0.06 |
| Comparative Example 4 | 1.82 | 0.06 | 11.18 | 0.99 | 12.54 | 0.00 | 0.16 | 0.08 |
| Comparative Example 5 | 2.46 | 0.04 | 10.54 | 1.18 | 12.45 | 0.00 | 0.23 | 0.09 |
| Comparative Example 6 | 2.72 | 0.05 | 10.28 | 1.32 | 12.55 | 0.00 | 0.26 | 0.11 |
| Example 5 | 2.88 | 0.04 | 10.12 | 0.88 | 13.06 | 0.41 | 0.28 | 0.07 |
| Example 6 | 2.85 | 0.04 | 10.15 | 0.85 | 13.02 | 0.06 | 0.28 | 0.07 |
| Example 7 | 2.78 | 0.05 | 10.22 | 0.89 | 12.96 | 0.06 | 0.27 | 0.07 |
| Example 8 | 2.82 | 0.05 | 10.18 | 0.88 | 12.89 | 0.06 | 0.28 | 0.07 |
| Example 9 | 2.81 | 0.08 | 10.19 | 0.95 | 13.29 | 0.01 | 0.28 | 0.07 |
| Comparative Example 7 | 2.84 | 0.09 | 10.16 | 0.99 | 13.34 | 0.01 | 0.28 | 0.07 |

TABLE 4

| | Powder X-ray diffraction analysis Results of crystal phase analysis | Excitation rate (at 400 nm) (%) | Absorptivity (at 400 nm) (%) | Light emission peak wavelength (nm) | Relative light emission peak intensity (%) |
|---|---|---|---|---|---|
| Comparative Example 1 | Target crystal phase | 76.8 | 59.5 | 483 | 87 |
| Example 1 | Target crystal phase | 80.3 | 60.3 | 484 | 100 |
| Example 2 | Target crystal phase | 82.5 | 62.0 | 483 | 104 |
| Example 3 | Target crystal phase | 82.4 | 64.6 | 483 | 111 |
| Example 4 | Target crystal phase | 85.6 | 67.7 | 483 | 110 |
| Comparative Example 2 | Target crystal phase + Sub phase | 82.1 | 62.6 | 483 | 100 |
| Comparative Example 3 | Crystal phase of other compound | 59.8 | 51.8 | 488 | 23 |
| Comparative Example 4 | Target crystal phase | 68.2 | 68.8 | 488 | 43 |
| Comparative Example 5 | Target crystal phase | 79.6 | 61.0 | 486 | 82 |
| Comparative Example 6 | Target crystal phase + Sub phase | 80.6 | 71.6 | 483 | 95 |
| Example 5 | Target crystal phase | 82.2 | 62.6 | 483 | 105 |
| Example 6 | Target crystal phase | 81.8 | 60.1 | 480 | 105 |
| Example 7 | Target crystal phase | 85.7 | 68.6 | 484 | 106 |
| Example 8 | Target crystal phase | 84.9 | 67.0 | 485 | 101 |
| Example 9 | Target crystal phase | 85.8 | 66.3 | 484 | 106 |
| Comparative Example 7 | Target crystal phase | 81.6 | 61.7 | 480 | 99 |

TABLE 5

| | Relative intensity of diffraction peak (%) Bragg angle (2θ) | | | | |
|---|---|---|---|---|---|
| | 33.0 to 33.6 | 35.4 to 36.0 | 37.6 to 38.2 | 59.8 to 60.4 | 60.5 to 61.1 |
| Comparative Example 1 | 17.95 | 87.24 | 12.01 | 16.55 | 5.75 |
| Example 1 | 16.82 | 100.00 | 10.02 | 14.48 | 7.93 |
| Example 2 | 17.81 | 100.00 | 11.67 | 15.01 | 9.53 |
| Example 3 | 11.40 | 100.00 | 8.71 | 7.80 | 7.61 |
| Example 4 | 17.13 | 100.00 | 12.35 | 5.95 | 8.72 |
| Comparative Example 2 | 62.43 | 100.00 | 21.97 | 6.55 | 11.60 |
| Comparative Example 3 | 26.17 | 10.85 | 14.38 | 17.90 | 5.21 |
| Comparative Example 4 | 9.26 | 95.49 | 7.06 | 5.99 | 2.40 |
| Comparative Example 5 | 38.54 | 100.00 | 13.71 | 9.20 | 7.62 |
| Comparative Example 6 | 93.76 | 68.49 | 25.90 | 4.40 | 9.76 |
| Example 5 | 20.64 | 100.00 | 17.11 | 10.46 | 12.84 |
| Example 6 | 20.66 | 100.00 | 15.23 | 10.93 | 13.59 |
| Example 7 | 15.15 | 100.00 | 11.68 | 6.38 | 9.12 |
| Example 8 | 14.16 | 100.00 | 10.12 | 5.27 | 8.03 |
| Example 9 | 22.11 | 100.00 | 13.77 | 6.94 | 9.07 |
| Comparative Example 7 | 29.88 | 100.00 | 23.02 | 21.29 | 14.49 |
| Simulation | 42.70 | 100.00 | 22.00 | 27.90 | 31.40 |

As shown in Table 3, it could be confirmed that even when using europium fluoride (EuF$_3$) as the raw material, fluorine (F) did not substantially remain in the resulting fluorescent material.

In addition, as shown in Tables 3 and 4, in the fluorescent materials of Examples 1 to 9, the relative light emission peak intensity was 100% or more, so that the light emission intensity became high. The fluorescent materials of Examples 1 to 9 had a novel crystal structure and had, as a host crystal, a crystal structure identical with the inorganic compound represented by Si$_{2.24}$Al$_{10.76}$O$_{0.76}$N$_{13.24}$. The fluorescent materials of Examples 1 to 9 were composed of the target crystal phase. In addition, in the fluorescent materials of Examples 1 to 9, the Si/Al ratio was 0.20 or more and 0.30 or less, and the O/N ratio was 0.01 or more and 0.08 or less.

On the other hand, in the fluorescent materials of Comparative Examples 1 to 7 except the fluorescent material of Comparative Example 2, the relative light emission peak intensity was less than 100%, so that the light emission intensity was low. In the fluorescent materials of Comparative Examples 1 to 7, as a result of the composition analysis, as for the composition ratio (molar ratio), the numerical value of any of parameters u, v, w, x, or y in the formula (I) was not a value satisfying the ranges represented by the formulae (1) to (5). In addition, though the fluorescent materials of Comparative Examples 2 and 6 had the target crystal phase, the sub phase was partially produced. In addition, in the fluorescent material of Comparative Example 3, a crystal phase of a compound having a composition that is different from the composition represented by Si$_{2.24}$Al$_{10.76}$O$_{0.76}$N$_{13.24}$ was produced.

As shown in Table 4, in the fluorescent materials of Examples 1 to 9, the excitation rate at 400 nm was more than 80%, and the absorptivity was more than 60%, so that it could be confirmed that these fluorescent materials efficiently absorbed the light emitted from the light emitting element and were excited, whereby the light emission intensity became high.

As shown in FIG. 4, in the fluorescent materials of Examples 1 to 9, as compared with the X-ray diffraction simulation pattern obtained by the powder X-ray diffractometry using CuKα rays as calculated from the crystal structure of the inorganic compound represented by Si$_{2.24}$Al$_{10.76}$O$_{0.76}$N$_{13.24}$, a peak was present in a position of the Bragg angle (2θ) substantially the same as the main peak of this X-ray diffraction simulation pattern. From those results, it could be confirmed that the fluorescent materials of Examples 1 to 9 have, as the host crystal, a crystal structure identical with the inorganic compound represented by Si$_{2.24}$Al$_{10.76}$O$_{0.76}$N$_{13.24}$ and are composed of the target crystal phase.

As shown in FIG. 4, in Comparative Examples 2 and 6, the sub phase was formed in addition to the target crystal phase, and the peak that is different from the X-ray diffraction simulation pattern was present. In the X-ray diffraction pattern of the fluorescent material of Comparative Example 3, the peak that is different from the X-ray diffraction simulation pattern was present, so that it was conjectured that a compound having a composition that is different from the composition represented by $Si_{2.24}Al_{10.76}O_{0.76}N_{13.24}$ is produced.

As shown in Table 5 and FIG. 4, in the X-ray diffraction pattern by CuKα rays, in the case of defining the intensity of the diffraction peak in which the Bragg angle (2θ) is existent in a range of 35.4° or more and 36.0° or less as 100%, the fluorescent materials of Examples 1 to 9 included a crystal phase in which the relative intensity of a diffraction peak at a Bragg angle (2θ) in a range of 33.0° or more and 33.6° or less is 10% or more and 45% or less, the relative intensity of a diffraction peak at a Bragg angle (2θ) in a range of 37.6° or more and 38.2° or less is 8% or more and 24% or less, the relative intensity of a diffraction peak at a Bragg angle (2θ) in a range of 59.8° or more and 60.4° or less is 3% or more and 30% or less, and the relative intensity of a diffraction peak at a Bragg angle (2θ) in a range of 60.5° or more and 61.1° or less is 6% or more and 32% or less.

As shown in FIG. 5 and Table 4, in the fluorescent materials of Examples 1 to 4, the light emission peak intensity was equal to or higher than that of the fluorescent material of Comparative Example 2.

As shown in FIG. 6 and Table 4, in the fluorescent materials of Examples 1 to 4, the excitation rate at 400 nm was 80% or more.

In addition, as shown in FIG. 7 and Table 4, in the fluorescent materials of Examples 1 to 4, the reflectance at 400 nm was less than 40%, in other words, the absorptivity at 400 nm was 60% or more, so that it could be confirmed that these fluorescent materials efficiently absorbed the light emitted from the light emitting element and were excited, whereby the light emission intensity became high.

A comparison of the SEM micrograph of the fluorescent material of Example 1 (FIG. 8) with the SEM micrograph of the fluorescent material of Comparative Example 1 (FIG. 9) confirms that the fluorescent material of Example 1 is larger in the particle diameter and less in the heterogeneity of particle diameter than the fluorescent material of Comparative Example 1.

The light emitting device using the fluorescent material according to an embodiment of the present disclosure can be utilized for general lighting, in-vehicle lighting, light sources of display devices, such as a display and a radar, and backlight light sources that are also applicable for liquid crystal display devices.

The invention claims is:

1. A fluorescent material comprising a composition represented by formula (I): $Si_uEu_vAl_wO_xN_y$, wherein when the sum of a parameter u and a parameter w is taken as 13, parameters u, v, w, x, and y in the formula (I) satisfy the following formulae (1) to (5):

$$2.77 \leq u \leq 2.88 \quad (1),$$

$$0.04 \leq v \leq 0.08 \quad (2),$$

$$10.12 \leq w \leq 10.23 \quad (3),$$

$$0.42 \leq x \leq 0.95 \quad (4), \text{ and}$$

$$12.89 \leq y \leq 13.65 \quad (5).$$

2. The fluorescent material according to claim 1, which has, as a host crystal, a crystal structure identical with a crystal structure of an inorganic compound represented by a formula: $Si_{2.24}Al_{10.76}O_{0.76}N_{13.24}$.

3. The fluorescent material according to claim 1, wherein in the composition represented by the formula (I), a molar ratio of silicon to aluminum (Si/Al ratio) is in a range of 0.20 or more and 0.30 or less, and a molar ratio of oxygen to nitrogen (O/N ratio) is in a range of 0.01 or more and 0.08 or less.

4. The fluorescent material according to claim 1, which includes a crystal phase in which when in an X-ray diffraction pattern by CuKα rays, an intensity of a diffraction peak at a Bragg angle (2θ) in a range of 35.4° or more and 36.0° or less is taken as 100%,
   a relative intensity of a diffraction peak at a Bragg angle (2θ) in a range of 33.0° or more and 33.6° or less is 10% or more and 45% or less,
   a relative intensity of a diffraction peak at a Bragg angle (2θ) in a range of 37.6° or more and 38.2° or less is 8% or more and 24% or less,
   a relative intensity of a diffraction peak at a Bragg angle (2θ) in a range of 59.8° or more and 60.4° or less is 3% or more and 30% or less, and
   a relative intensity of a diffraction peak at a Bragg angle (2θ) in a range of 60.5° or more and 61.1° or less is 6% or more and 32% or less.

5. A light emitting device comprising the fluorescent material according to claim 1 and an excitation light source.

6. The light emitting device according to claim 5, wherein the excitation light source has a light emission peak wavelength in a wavelength region of from a near ultraviolet light to a visible light.

7. A method of producing a fluorescent material, comprising subjecting a raw material mixture including $EuF_3$ to a heat treatment to obtain a fluorescent material comprising a composition represented by formula (I): $Si_uEu_vAl_wO_xN_y$, wherein when the sum of a parameter u and a parameter w is taken as 13, parameters u, v, w, x, and y in the formula (I) satisfy the following formulae (1) to (5):

$$2.77 \leq u \leq 2.88 \quad (1),$$

$$0.04 \leq b \leq 0.08 \quad (2),$$

$$10.12 \leq w \leq 10.23 \quad (3),$$

$$0.42 \leq x \leq 0.95 \quad (4), \text{ and}$$

$$12.89 \leq y \leq 13.65 \quad (5).$$

8. The method of producing a fluorescent material according to claim 7, wherein in the composition, a molar ratio of silicon to aluminum (Si/Al ratio) is in a range of 0.20 or more and 0.30 or less, and a molar ratio of oxygen to nitrogen (O/N ratio) is in a range of 0.01 or more and 0.08 or less.

* * * * *